United States Patent
Kim et al.

(10) Patent No.: US 9,236,255 B2
(45) Date of Patent: *Jan. 12, 2016

(54) METHODS FOR FORMING THREE DIMENSIONAL NAND STRUCTURES ATOP A SUBSTRATE

(71) Applicant: APPLIED MATERIALS, INC., Santa Clara, CA (US)

(72) Inventors: Sang Wook Kim, Palo Alto, CA (US); Han Soo Cho, San Jose, CA (US); Joo Won Han, Santa Clara, CA (US); Kee Young Cho, San Jose, CA (US); Kuan-Ting Liu, Stanford, CA (US); Anisul Khan, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/313,246

(22) Filed: Jun. 24, 2014

(65) Prior Publication Data

US 2015/0004796 A1 Jan. 1, 2015

Related U.S. Application Data

(60) Provisional application No. 61/839,654, filed on Jun. 26, 2013.

(51) Int. Cl.
| | |
|---|---|
| H01L 21/3065 | (2006.01) |
| H01L 21/308 | (2006.01) |
| H01L 21/027 | (2006.01) |
| H01L 21/311 | (2006.01) |
| H01L 21/3213 | (2006.01) |
| H01L 27/115 | (2006.01) |

(52) U.S. Cl.
CPC ...... *H01L 21/0273* (2013.01); *H01L 21/31116* (2013.01); *H01L 21/31138* (2013.01); *H01L 21/31144* (2013.01); *H01L 21/32137* (2013.01); *H01L 21/32139* (2013.01); *H01L 27/11548* (2013.01); *H01L 27/11575* (2013.01)

(58) Field of Classification Search
None
See application file for complete search history.

(56) References Cited

U.S. PATENT DOCUMENTS

| | | | |
|---|---|---|---|
| 6,235,214 B1 | 5/2001 | Deshmukh et al. | |
| 6,312,616 B1 | 11/2001 | Chinn et al. | |
| 6,583,063 B1 | 6/2003 | Khan et al. | |
| 8,133,817 B2 | 3/2012 | Sasano et al. | |

(Continued)

OTHER PUBLICATIONS

U.S. Appl. No. 14/306,535, filed Jun. 17, 2014, Cho et al.

*Primary Examiner* — Allan Olsen
(74) *Attorney, Agent, or Firm* — Moser Taboada; Alan Taboada

(57) ABSTRACT

In some embodiments, a method of forming a three dimensional NAND structure atop a substrate may include providing to a process chamber a substrate having alternating nitride layers and oxide layers or alternating polycrystalline silicon layers and oxide layers formed atop the substrate and a photoresist layer formed atop the alternating layers; etching the photoresist layer to expose at least a portion of the alternating nitride layers and oxide layers or alternating polycrystalline silicon layers and oxide layers; providing a process gas comprising sulfur hexafluoride ($SF_6$), carbon tetrafluoride ($CF_4$), and oxygen ($O_2$) to the process chamber; providing an RF power of about 4 kW to about 6 kW to an RF coil to ignite the process gas to form a plasma; and etching through a desired number of the alternating layers to form a feature of a NAND structure.

20 Claims, 5 Drawing Sheets

(56) References Cited

U.S. PATENT DOCUMENTS

| | | |
|---|---|---|
| 8,435,419 B2 | 5/2013 | Ding et al. |
| 2013/0224960 A1 | 8/2013 | Payyapilly et al. |
| 2013/0319614 A1* | 12/2013 | Lee et al. .................. 156/345.24 |
| 2015/0004796 A1* | 1/2015 | Kim et al. ..................... 438/719 |
| 2015/0087154 A1* | 3/2015 | Guha et al. .................... 438/703 |

* cited by examiner

US 9,236,255 B2

METHODS FOR FORMING THREE DIMENSIONAL NAND STRUCTURES ATOP A SUBSTRATE

CROSS-REFERENCE TO RELATED APPLICATIONS

This application claims benefit of U.S. provisional patent application Ser. No. 61/839,654, filed Jun. 26, 2014, which is herein incorporated by reference in its entirety.

FIELD

Embodiments of the present invention generally relate to semiconductor device fabrication.

BACKGROUND

The inventors have observed that conventional etch methods utilized to form features in the fabrication of three dimensional devices (e.g., negated and or not-and (NAND) devices) typically display an undesirably low ratio of lateral etch to vertical etch (L/V ratio). Such low L/V ratios may result in undesirable process results during the fabrication of the device. For example, a low L/V ratio may cause a photoresist utilized to define the features to be prematurely consumed, thereby limiting a number and/or the dimensions of a feature that may be formed.

Thus, the inventors have provided improved methods for forming three dimensional NAND structures atop a substrate

SUMMARY

Methods for forming three dimensional NAND structures atop a substrate are provided herein. In some embodiments, a method for forming a three dimensional NAND structure may include: providing to a process chamber a substrate having alternating nitride layers and oxide layers or alternating polycrystalline silicon layers and oxide layers formed atop the substrate and a photoresist layer formed atop the alternating nitride layers and oxide layers or alternating polycrystalline silicon layers and oxide layers; etching the photoresist layer to expose at least a portion of the alternating nitride layers and oxide layers or alternating polycrystalline silicon layers and oxide layers; providing a process gas comprising sulfur hexafluoride ($SF_6$), carbon tetrafluoride ($CF_4$), and oxygen ($O_2$) to the process chamber; providing an RF power of about 4 kW to about 6 kW to an RF coil disposed proximate the process chamber to ignite the process gas to form a plasma; and etching through a desired number of the alternating nitride layers and oxide layers or alternating polycrystalline silicon layers and oxide layers form a feature of a NAND structure.

In some embodiments, a computer readable medium, having instructions stored thereon that, when executed, cause a method of forming a three dimensional negated and or not-and (NAND) structure atop a substrate to be performed. The method may include: providing to a process chamber a substrate having alternating nitride layers and oxide layers or alternating polycrystalline silicon layers and oxide layers formed atop the substrate and a photoresist layer formed atop the alternating nitride layers and oxide layers or alternating polycrystalline silicon layers and oxide layers; etching the photoresist layer to expose at least a portion of the alternating nitride layers and oxide layers or alternating polycrystalline silicon layers and oxide layers; providing a process gas comprising sulfur hexafluoride ($SF_6$), carbon tetrafluoride ($CF_4$), and oxygen ($O_2$) to the process chamber; providing an RF power of about 4 kW to about 6 kW to an RF coil disposed proximate the process chamber to ignite the process gas to form a plasma; and etching through a desired number of the alternating nitride layers and oxide layers or alternating polycrystalline silicon layers and oxide layers form a feature of a NAND structure.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
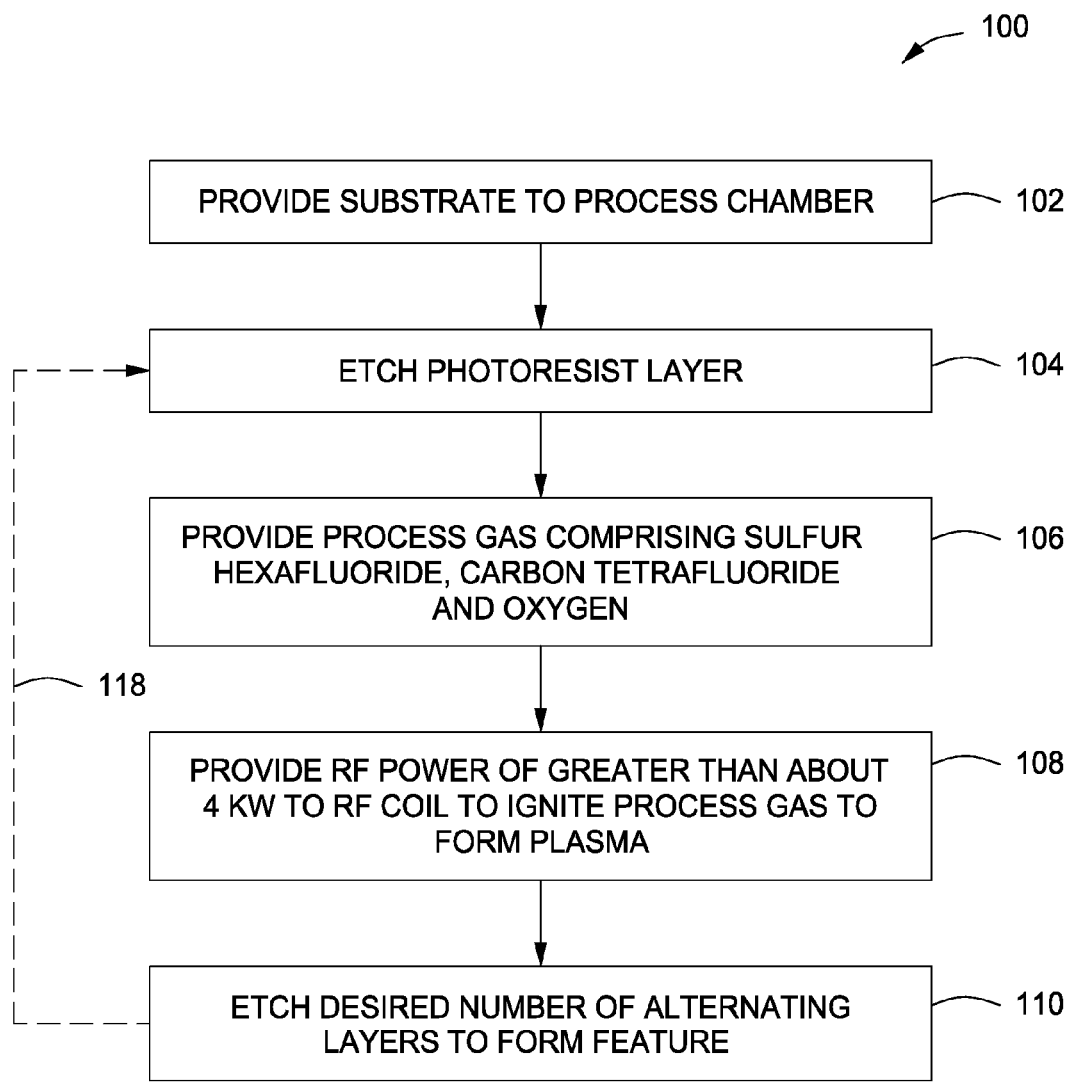
FIG. 1 depicts a method for forming three dimensional NAND structures atop a substrate in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of methods for forming three dimensional NAND structures atop substrates are provided herein. In at least some embodiments, the inventive method may advantageously provide an increased lateral to vertical etch ratio (L/V ratio) and reduce vertical consumption of a photoresist, thereby allowing for an increased number of features to be formed without increasing a thickness of the photoresist. In addition, the inventive process may further advantageously increase an overall etch rate of one or more layers disposed atop the substrate, thereby improving the throughput of the process as compared to conventionally utilized NAND structure fabrication processes.

FIG. 1 is method for forming three dimensional NAND structures atop a substrate in accordance with some embodiments of the present invention. The method begins at 102 where a substrate is provided to a process chamber. The process chamber may be any type of process chamber suitable to perform one or more etch processes as described herein, for example, an etch chamber (e.g., process chamber), such as described below with respect to FIG. 3.

The substrate may be any type of substrate suitable for semiconductor device fabrication. For example, referring to FIG. 2A, the substrate 200 may be a silicon substrate, for example crystalline silicon (e.g., Si<100> or Si<111>), silicon oxide, strained silicon, doped or undoped polysilicon, or the like, a III-V or II-VI compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like. In some embodiments, the substrate 200 may include one or more layers (not shown) formed within the substrate 200, for example, one or more of a dielectric layer, tunnel oxide layer, or the like.

Figure 2A:
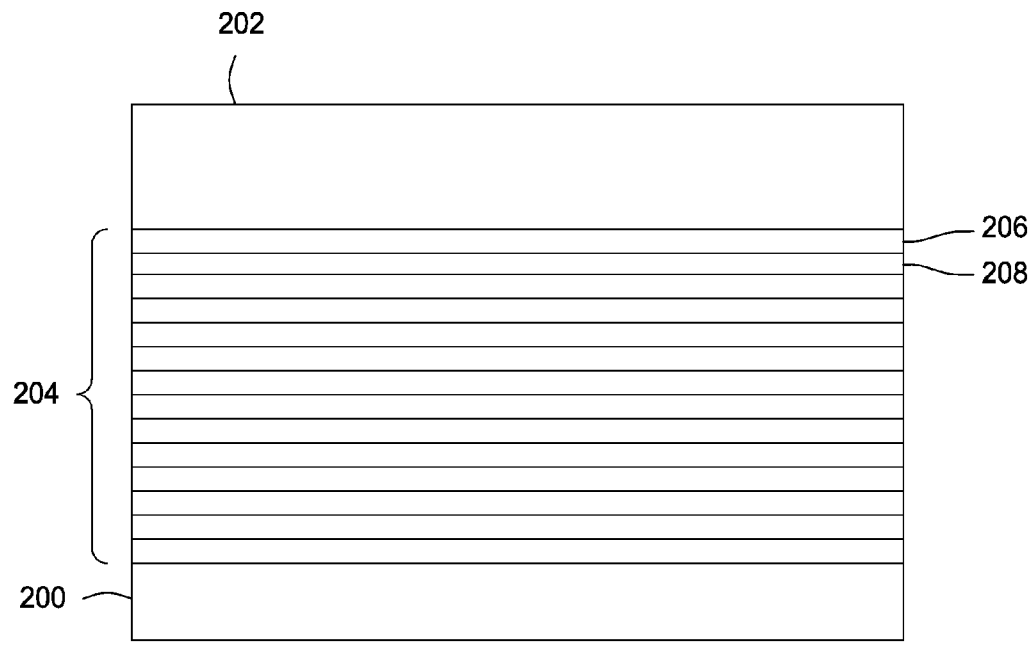
FIGS. 2A-F respectively depict a substrate through various stages of a method for forming three dimensional NAND structures atop a substrate in accordance with some embodiments of the present invention.

In some embodiments, one or more layers may be disposed atop the substrate 200. For example, in some embodiments, a gate stack 204 having a plurality of layers (e.g., layers 206, 208) may be disposed atop the substrate 200, such as shown in FIG. 2A. The plurality of layers may comprise any materials suitable to fabricate a desired device. For example, in some embodiments, the plurality of layers may include one or more polycrystalline silicon layers, one or more oxide layers, such as silicon oxide ($SiO_2$), or the like, one or more nitride layers, such as silicon nitride ($Si_3N_4$), or the like, combinations thereof, or the like. As used herein, a layer described with a modifier, such as a "polycrystalline silicon layer", an "oxide layer", a "nitride layer", or the like, contemplates that the layer is composed predominantly, or essentially only, of the material recited in the modifier (e.g., polycrystalline silicon, an oxide, a nitride, or the like, and other materials, for example, such as impurities, may be present in small or trace amounts in the layer.

In some embodiments, the plurality of layers may comprise alternating oxide layers and nitride layers or alternating polycrystalline silicon layers and oxide layers. For example, in some embodiments, a first layer (e.g., layer 208) may comprise a nitride layer or a polycrystalline silicon layer and a second layer (e.g., layer 206) disposed atop the first layer may comprise an oxide layer. The pattern (e.g., the first layer comprising a nitride layer or a polycrystalline silicon layer and the second layer comprising an oxide layer) may repeat any number of times necessary to form a gate stack 204 having a desired thickness.

Each of the layers may have any thickness suitable to facilitate fabricating a desired device. For example, in some embodiments, each of the layers may be about 100 Å to about 600 Å thick, or in some embodiments, about 300 Å thick. In some embodiments, the layers may all have the same thickness, or in some embodiments, the layers may have varying thicknesses.

In some embodiments, a photoresist layer 202 may be disposed atop the gate stack 204, such as shown in FIG. 2A. The photoresist layer 202 may comprise any photoresist materials suitable to provide a template to facilitate etching the gate stack 204 having desired features (e.g., as described below). For example, in some embodiments, the photoresist layer 202 may be a positive or negative photoresist and/or a DUV or EUV (deep ultraviolet or extreme ultraviolet) photoresist and may comprise one or more of polymers, organic compounds (e.g., comprising carbon, hydrogen and oxygen), an amorphous carbon, such as Advanced Patterning Film (APF), available from Applied Materials, Inc., located in Santa Clara, Calif., a tri-layer resist (e.g., a photoresist layer, a Si-rich anti-reflective coating (ARC) layer, and a carbon-rich ARC, or bottom ARC (BARC) layer), a spin-on hardmask (SOH), or the like. The photoresist layer 202 may be formed by any suitable process, for example, a patterned etch process, spin coating process, optical lithography techniques, or the like. The photoresist layer 202 may be formed to any thickness suitable to etch a desire number of features in the gate stack 204. For example, in some embodiments, the photoresist layer may be about up to about 10 um thick, for example, such as about 1 um or about 5 um thick.

Figure 2B:
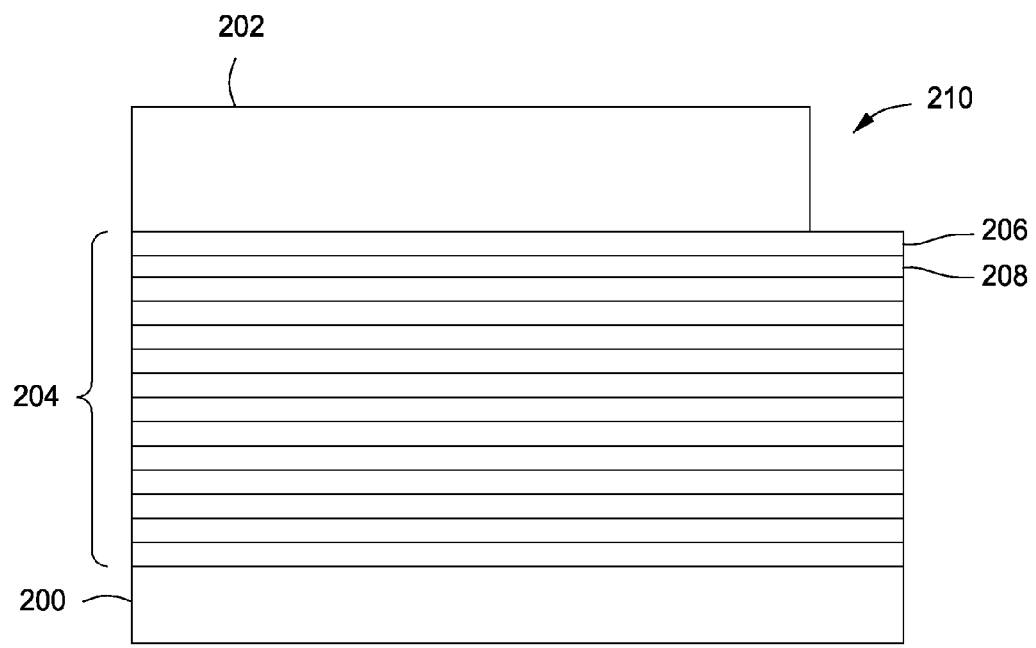

Next, at 104, the photoresist layer 202 is etched to expose at least a portion of the alternating oxide and nitride layers and define a feature 210 to be formed in the alternating oxide and nitride layers or alternating polycrystalline silicon layers and oxide layers (collectively "alternating layers") of the gate stack 204, as shown in FIG. 2B. The photoresist layer 202 may be etched via any etch process suitable to selectively etch the photoresist layer 202 to define the feature 210. In some embodiments, the etch process may be an isotropic etching process to reduce a thickness and a width of the photoresist layer 202 while minimizing significant undercutting of the photoresist layer 202. For example, in some embodiments, the photoresist layer 202 may be etched via a dry etch process, such as exposing the photoresist layer 202 to an oxygen containing plasma for a desired amount of time.

Next, at 106, a process gas comprising sulfur hexafluoride ($SF_6$), carbon tetrafluoride ($CF_4$) and oxygen ($O_2$) is provided to the process chamber.

The inventors have observed that conventional etch methods utilized to form features in the fabrication of three dimensional devices (e.g., negated and or not-and (NAND) devices) typically display an undesirably low ratio of lateral etch to vertical etch (L/V ratio). Such low L/V ratios may result in undesirable process results during the fabrication of the device. For example, a low L/V ratio may cause a photoresist (e.g., the photoresist layer 202) utilized to define the features to be prematurely consumed, thereby limiting a number and/or the dimensions of a feature that may be formed.

As such, the inventors have observed that providing a process gas comprising sulfur hexafluoride ($SF_6$), carbon tetrafluoride ($CF_4$) and oxygen ($O_2$) can advantageously increase a lateral to vertical etch ratio of the photoresist layer 202 and/or the gate stack 204 layers during an etch process (e.g., etching of the first layer (layer 208) and second layer (layer 206) as described below) as compared to conventional etch methods. For example, in some embodiments, the lateral to vertical etch ratio may be about 0.1 to about 2.0, or in some embodiments, about 0.7.

While not intending to be bound by theory, the inventors believe that by providing carbon tetrafluoride ($CF_4$), an optical emission of a plasma formed within the process chamber to etch the layers of the gate stack 204 (e.g., as described below) may at least partially cure a surface of the photoresist layer 202 to retard a vertical etch rate of the photoresist layer 202, thereby increasing the lateral to vertical etch ratio. In addition, the inventors believe that providing sulfur hexafluoride ($SF_6$) may increase a uniformity of the photoresist etch rate.

The sulfur hexafluoride ($SF_6$), carbon tetrafluoride ($CF_4$) and oxygen ($O_2$) may be provided in any ratio suitable to provide the desired lateral to vertical etch ratio as described above. For example, in some embodiments, carbon tetrafluoride ($CF_4$) may be provided at a flow that is about 0.5% to about 20%, or in some embodiments, about 5% of the total flow of the process gas. In some embodiments, sulfur hexafluoride ($SF_6$) may be provided at a flow that is about 0.5% to about 20%, or in some embodiments, about 5% of the total flow of the process gas. In some embodiments, oxygen ($O_2$) may be provided at about 60% to about 99.5% of a total flow of the process gas. In addition, in some embodiments, the process gas may include a carrier gas, for example, an inert gas (e.g., helium (He), argon (Ar), nitrogen ($N_2$) or the like) to facilitate delivery and distribution of the process gas within the process chamber. The helium (He), argon (Ar), and nitrogen (N2) may be provided in any ratio suitable to provide the desired uniformity of the features as described above. In some embodiments, each of the helium (He), argon (Ar), and nitrogen (N2) may be provided at a flow that is about 5% to about 30% of the total flow of the process gas. For example, in embodiments where nitrogen ($N_2$) is included in the process gas, the nitrogen ($N_2$) may be provided at a flow rate that is about 5% to about 30% of the total flow of the process gas. The inventors have observed that the inclusion of nitrogen ($N_2$) may advantageously increase the photoresist ash rate (e.g., the photoresist removal rate).

Next, at 108, an RF power of greater than about 4 kW is provided to an electrode, such as an RF coil, to ignite the process gas to form a plasma. The RF power may be provided at any magnitude greater than about 4 kW, for example, such as about 4 KW to about 6 kW, or in some embodiments, about 4.5 kW. The RF power may be provided at any frequency, for example, such as about 13.56 MHz. In some embodiments, the RF coil may be disposed proximate the process chamber, for example, such as the inductive coil element 312 of the etch reactor 300 described below with respect to FIG. 3.

The inventors have observed that conventional etch methods utilized to form features in the fabrication of three dimensional devices (e.g., negated and or not-and (NAND) devices) typically display an undesirably slow etch rate, thereby providing a fabrication process that lacks efficiency and provides low throughput. However, the inventors have observed that providing a higher RF power (as compared to conventional processes) increases the etch rate, thereby increasing the efficiency and throughput of the fabrication process. As such, by providing the RF power at the aforementioned magnitudes, the inventors have observed that a total process time may be reduced. For example, the inventors have observed that in some embodiments, a total time required to form a NAND structure may be reduced from over 10 minutes (e.g., about 14 minutes) to less than about 6 minutes, or about 5 minutes.

Additional process parameters may be utilized to promote plasma ignition and stability. For example, in some embodiments, the process chamber may be maintained at a temperature of between 0 to about 150 degrees Celsius during plasma ignition. In some embodiments, the temperature may be dependent on the composition and/or size of the substrate. Additionally, in some embodiments, the process chamber may be maintained at a pressure of between about 2 to about 250 mTorr.

Figure 2C:
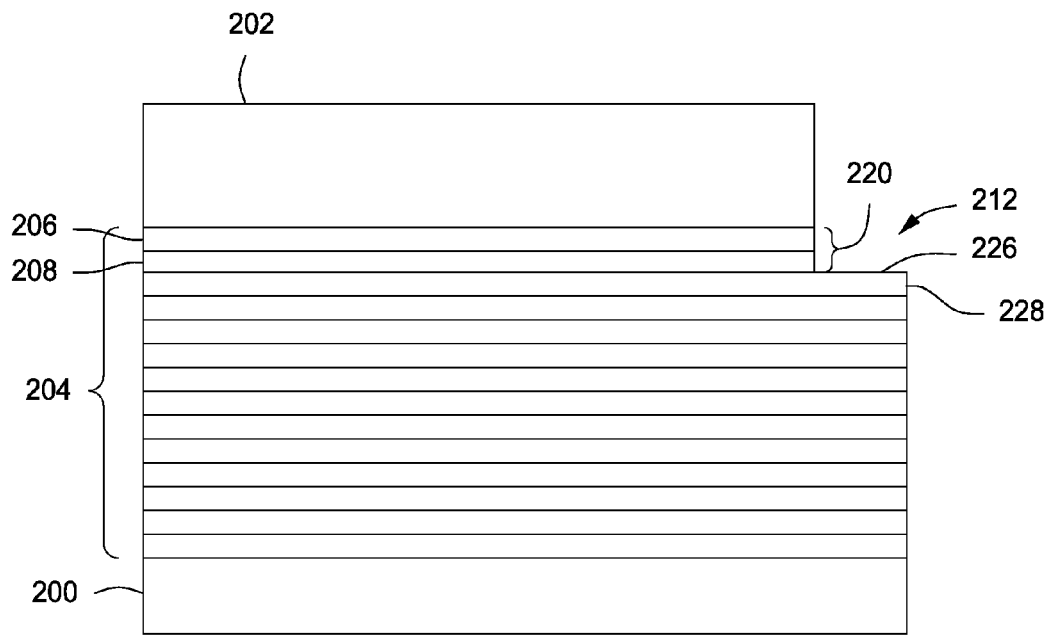

Next, at 110, a desired number of the alternating layers are etched to form a feature 212 of a NAND structure, as shown in FIG. 2C. Any number of the layers may be etched to form the feature 212. For example, in some embodiments, a first set of layers 220 that include one nitride layer or polycrystalline silicon layer (e.g., layer 208) and one oxide layer (e.g., layer 206) may be etched to form the feature 212, such as shown in FIG. 2C. In such embodiments, the feature 212 may be etched through the nitride layer or polycrystalline silicon layer (layer 208) such that a bottom 226 of the feature 212 comprises an exposed portion of an underlying oxide layer (e.g., layer 228).

Generally, to facilitate etching, high energy ions from the plasma are accelerated towards the gate stack 204 to cause material to be ejected from the layers (e.g., layers 206, 208), thereby etching the feature 212 into the layers 206, 208. In some embodiments, the ions may be directed toward the gate stack 204 via a self bias formed on the substrate 200 resulting from the application of RF power to the process gas to form the plasma, as discussed above. Alternatively, or in combination, to facilitate directing the ions towards the gate stack 204 an additional bias power may be provided to the substrate 200 via a substrate support disposed in a process chamber, for example, such as discussed below with respect to FIG. 3.

Additional process parameters may be utilized to facilitate etching the layers 208, 206 to form the feature 212. For example, in some embodiments, the process chamber may be maintained at a temperature of between about 30 degrees to about 150 degrees Celsius, or in some embodiments, about 70 degrees Celsius during etching. Additionally, in some embodiments, the process chamber may be maintained at a pressure of between about 2 mTorr to about 250 mTorr.

Figure 2D:
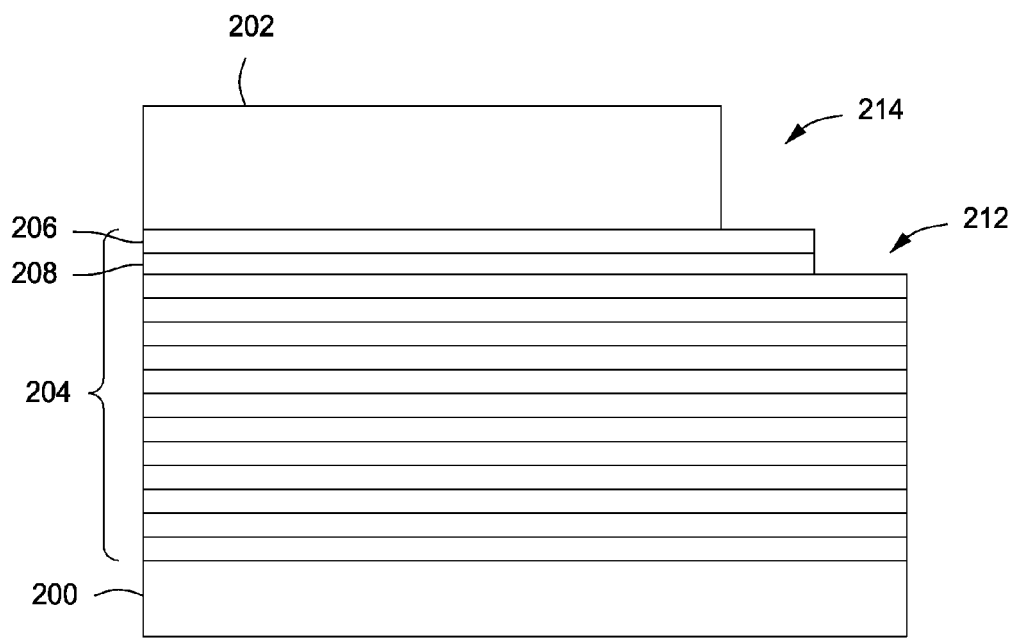
Figure 2E:
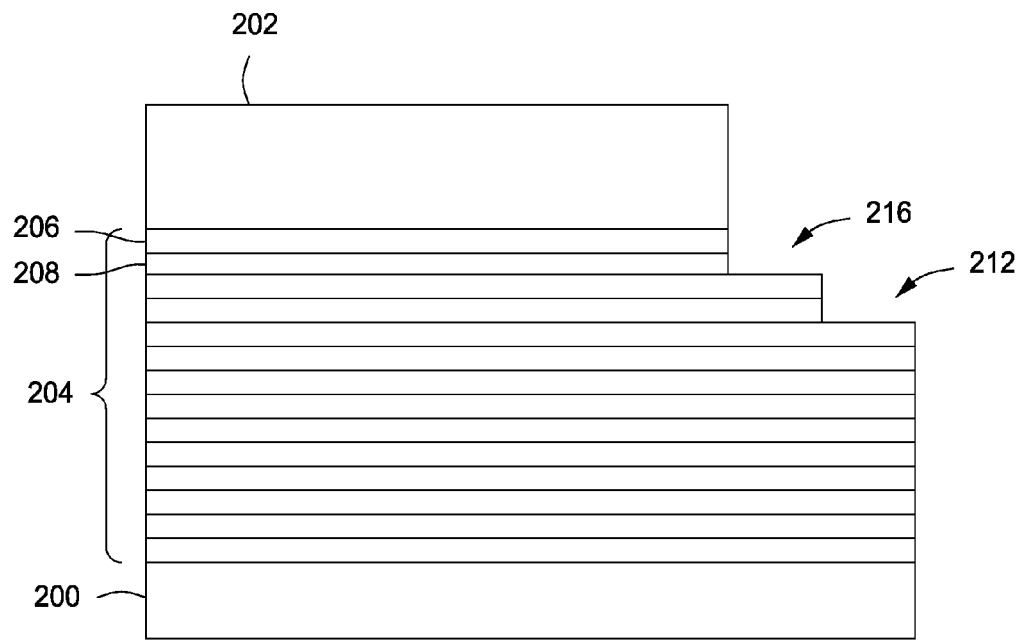

In some embodiments, after forming the feature 212 of a NAND structure at 110, the method 100 may be at least partially repeated to form additional features. In such embodiments, after forming the feature 212 of a NAND structure, at 110, the method 100 may return to 104 (as indicated by arrow 118) where the etching of the photoresist layer 202 (as described above) may be repeated to define an additional feature 214, such as shown in FIG. 2D. The method 100 may then continue through 110 again to form an additional feature (e.g., feature 216) in the gate stack 204, as shown in FIG. 2E.

At each iteration, the exposed portions of overlaying layers of the gate stack 204 may function as a mask for the etching of underlying layers of the gate stack 204. For example, as shown in FIGS. 2D and 2E, exposed portions of layers 206, 208 function as a mask while etching the feature 216 into the layers 206, 208, thereby extending the feature 212 into the next set of layers disposed beneath the first set of layers 220.

Figure 2F:
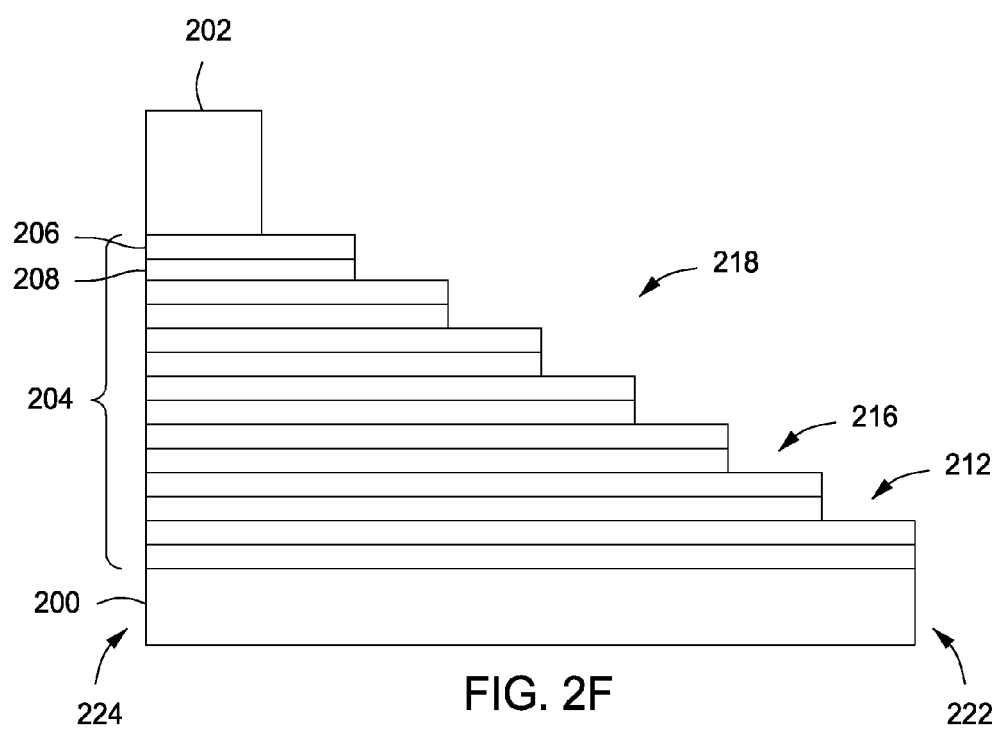

The process may be repeated any number of times to form a desired number of features to at least partially form a NAND staircase structure. For example, in some embodiments, a plurality of adjacent features (e.g., seven features) may be formed to at least partially form a NAND staircase structure 218 atop the substrate 200. In such embodiments, a depth of each feature of the plurality of features may decrease from a first side 222 of the NAND staircase structure 218 to a second side 224 of the NAND staircase structure 218 to form a staircase structure, for example, such as shown in FIG. 2F. Upon completion of the formation of the desired number of features, the method 100 generally ends and the substrate 200 may be further processed as desired.

Figure 3:
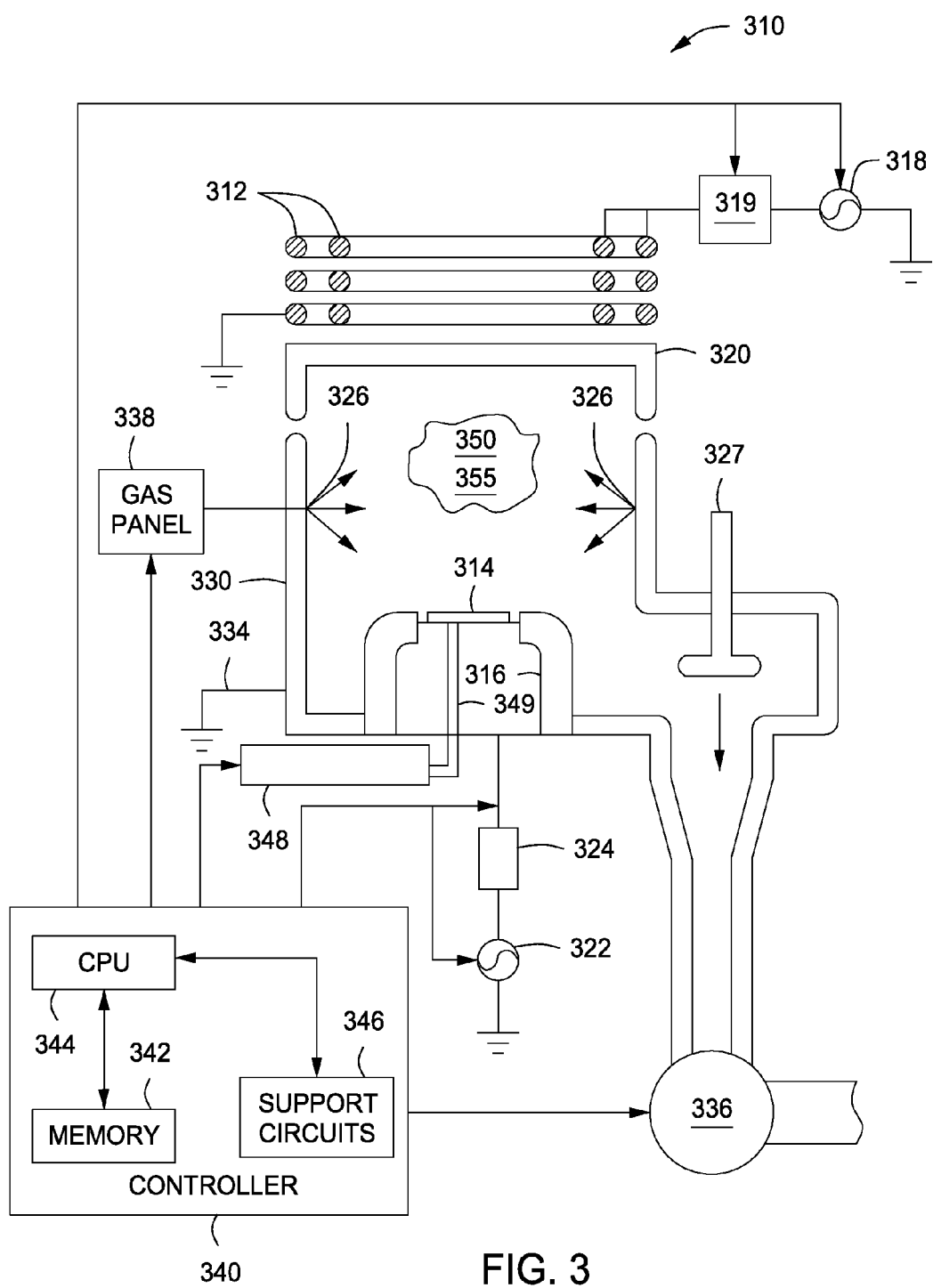
FIG. 3 depicts a process chamber suitable to perform a method for forming three dimensional NAND structures atop a substrate in accordance with some embodiments of the present invention.

FIG. 3 depicts a schematic diagram of an illustrative etch reactor 300 of the kind that may be used to practice embodiments of the invention as discussed herein. The etch reactor 300 may be utilized alone or as a processing module of an integrated semiconductor substrate processing system, or cluster tool, such as a CENTURA® integrated semiconductor substrate processing system, available from Applied Materials, Inc. of Santa Clara, Calif. Examples of suitable etch reactors include the ADVANTEDGE™ line of etch reactors (such as the AdvantEdge G3 or the AdvantEdge G5), the DPS® line of etch reactors (such as the DPS®, DPS® II, DPS® AE, DPS® HT, DPS® G3 poly etcher), or other etch reactors, also available from Applied Materials, Inc. Other etch reactors and/or cluster tools may suitably be used as well.

The etch reactor 300 comprises a chamber 310 having a substrate support (cathode) 316 within a conductive body (wall 330), and a controller 340. The chamber 310 may be supplied with a substantially flat dielectric ceiling 320. Alternatively, the chamber 310 may have other types of ceilings, e.g., a dome-shaped ceiling. An antenna comprising at least one inductive coil element (RF coil) 312 is disposed above the ceiling 320 (two co-axial inductive coil elements 312 are shown). The inductive coil element 312 is coupled to a plasma power source 318 through a first matching network 319. The plasma power source 318 typically is capable of producing up to 6000 W at a tunable frequency in a range from 50 KHz to 13.56 MHz. The plasma power source 318 may be operable in a continuous wave (CW) or pulsed mode. When in pulse mode, the plasma power source 318 may be pulsed at a pulse frequency of up to about 100 KHz, or in some embodiments, between about 100 Hz to about 100 KHz. The plasma power source 318 may be operated at a duty cycle (e.g., the percentage of on time during the total of on time and off time in a given cycle) of between about 10% and about 90%.

The substrate support 316 is coupled, through a second matching network 324, to a biasing power source 322. The biasing power source 322 generally is capable of producing up to 1500 W at a frequency of approximately 13.56 MHz. The biasing power may be either continuous or pulsed power. In other embodiments, the biasing power source 322 may be a DC or pulsed DC source. The biasing power source 322 may be operable in a continuous wave (CW) or pulsed mode. When in pulse mode, the biasing power source 322 may be pulsed at a pulse frequency of up to about 100 kHz, or in some embodiments, between about 100 Hz to about 100 KHz. The biasing power source 322 may be operated at a duty cycle (e.g., the percentage of on time during the total of on time and off time in a given cycle) of between about 10% and about 90%.

A controller 340 comprises a central processing unit (CPU) 344, a memory 342, and support circuits 346 for the CPU 344 and facilitates control of the components of the chamber 310 and, as such, of the etch process, as discussed below in further detail.

In operation, a substrate 314 is placed on the substrate support 316 and process gases are supplied from a gas panel 338 through entry ports 326 and form a gaseous mixture 350. The gaseous mixture 350 is ignited into a plasma 355 in the chamber 310 by applying power from the plasma power source 318 and/or biasing power source 322 to the inductive coil element 312 and the substrate support 316, respectively. The pressure within the interior of the chamber 310 is controlled using a throttle valve 327 and a vacuum pump 336. Typically, the wall 330 is coupled to an electrical ground 334. The temperature of the wall 330 is controlled using liquid-containing conduits (not shown) that run through the wall 330.

In some embodiments, a temperature of the substrate 314 may be controlled by stabilizing a temperature of the substrate support 316. In one embodiment, a heat transfer fluid (e.g., a helium gas) from a heat transfer fluid source 348 is provided via a gas conduit 349 to channels (not shown) formed in the pedestal surface under the substrate 314. The heat transfer fluid is used to facilitate heat transfer between the substrate support 316 and the substrate 314. During processing, the substrate support 316 may be heated by a resistive heater (not shown) within the pedestal to a steady state temperature and then the helium gas facilitates uniform heating of the substrate 314. Using such thermal control, the substrate 314 may be maintained at a temperature of between about 0-650 degrees Celsius.

Other etch chambers may be used to practice the invention, including chambers with remote plasma sources, electron cyclotron resonance (ECR) plasma chambers, and the like.

To facilitate control of the process chamber 310 as described above, the controller 340 may be one of any form of general-purpose computer processor that can be used in an industrial setting for controlling various chambers and sub-processors. The memory 342, or computer-readable medium, of the CPU 344 may be one or more of readily available memory such as random access memory (RAM), read only memory (ROM), floppy disk, hard disk, or any other form of digital storage, local or remote. The support circuits 346 are coupled to the CPU 344 for supporting the processor in a conventional manner. These circuits include cache, power supplies, clock circuits, input/output circuitry and subsystems, and the like. The inventive method described herein is generally stored in the memory 342 as a software routine. The software routine may also be stored and/or executed by a second CPU (not shown) that is remotely located from the hardware being controlled by the CPU 344.

Thus, embodiments of methods for forming three dimensional NAND structures atop substrates have been provided herein. In at least some embodiments, the inventive method may advantageously provide an increased lateral to vertical etch ratio (L/V ratio) and increase an overall etch rate of one or more layers disposed atop the substrate, thereby improving the throughput of the process as compared to conventionally utilized NAND structure fabrication processes.

While the foregoing is directed to embodiments of the present invention, other and further embodiments of the invention may be devised without departing from the basic scope thereof.

The invention claimed is:

1. A method of forming a three dimensional negated and or not-and (NAND) structure atop a substrate, comprising:
   (a) providing to a process chamber a substrate having alternating nitride layers and oxide layers or alternating polycrystalline silicon layers and oxide layers formed atop the substrate and a photoresist layer formed atop the alternating nitride layers and oxide layers or alternating polycrystalline silicon layers and oxide layers;
   (b) etching the photoresist layer to expose at least a portion of the alternating nitride layers and oxide layers or alternating polycrystalline silicon layers and oxide layers;
   (c) providing a process gas comprising sulfur hexafluoride ($SF_6$), carbon tetrafluoride ($CF_4$), and oxygen ($O_2$) to the process chamber;
   (d) providing an RF power of about 4 kW to about 6 kW to an RF coil disposed proximate the process chamber to ignite the process gas to form a plasma; and
   (e) etching through a desired number of the alternating nitride layers and oxide layers or alternating polycrystalline silicon layers and oxide layers to form a feature of a NAND structure.

2. The method of claim 1, further comprising:
   (f) repeating (b)-(e) to form a plurality of adjacent features to at least partially form the NAND structure atop the substrate, wherein a depth of each feature decreases from a first side of the NAND structure to a second side of the NAND structure.

3. The method of claim 2, wherein the plurality of adjacent features form a NAND staircase structure.

4. The method of claim 1, wherein a bottom of the feature comprises an exposed portion of an oxide layer of the alternating nitride layers and oxide layers or alternating polycrystalline silicon layers and oxide layers.

5. The method of claim 1, wherein etching the photoresist layer comprises isotropically etching the photoresist layer to reduce a thickness and a width of the photoresist layer.

6. The method of claim 1, wherein the process gas further comprises at least one of nitrogen ($N_2$) or helium (He).

7. The method of claim 1, wherein providing the process gas comprises providing sulfur hexafluoride ($SF_6$) at about 5% to about 15% of a total flow of the process gas provided to the process chamber.

8. The method of claim 1, wherein providing the process gas comprises providing carbon tetrafluoride ($CF_4$) at about 5% to about 15% of a total flow of the process gas provided to the process chamber.

9. The method of claim 1, wherein providing the process gas comprises providing oxygen ($O_2$) at about 80% to about 90% of a total flow of the process gas provided to the process chamber.

10. The method of claim 1, wherein providing the RF power comprises providing an RF power at about 4.5 kW.

11. The method of claim 1, wherein lateral to vertical etch ratio of at least one of the photoresist layer or alternating nitride and oxide layers is about 0.1 to about 2.0.

12. The method of claim 1, further comprising maintaining the process chamber at a pressure of between about 50 to about 90 mTorr while performing (e).

13. A method of forming a three dimensional negated and or not-and (NAND) structure atop a substrate, comprising:
 (a) providing to a process chamber a substrate having alternating nitride layers and oxide layers or alternating polycrystalline silicon layers and oxide layers formed atop the substrate and a photoresist layer formed atop the alternating nitride layers and oxide layers or alternating polycrystalline silicon layers and oxide layers;
 (b) etching the photoresist layer to expose at least a portion of the alternating nitride layers and oxide layers or alternating polycrystalline silicon layers and oxide layers;
 (c) providing a process gas comprising sulfur hexafluoride ($SF_6$), carbon tetrafluoride ($CF_4$), and oxygen ($O_2$) to the process chamber, wherein the sulfur hexafluoride ($SF_6$) is provided at about 5% to about 15% of a total flow of the process gas provided to the process chamber, the carbon tetrafluoride ($CF_4$) is provided at about 5% to about 15% of a total flow of the process gas provided to the process chamber, and the oxygen ($O_2$) is provided at about 80% to about 90% of a total flow of the process gas provided to the process chamber;
 (d) providing an RF power of about 4 kW to about 6 kW to an RF coil disposed proximate the process chamber to ignite the process gas to form a plasma
 (e) etching through a desired number of the alternating nitride layers and oxide layers or alternating polycrystalline silicon layers and oxide layers to form a feature of a NAND structure, while maintaining the process chamber at a pressure of between about 50 to about 90 mTorr; and
 (f) repeating (b)-(e) to form a plurality of adjacent features to at least partially form the NAND structure atop the substrate, wherein a depth of each feature decreases from a first side of the NAND structure to a second side of the NAND structure.

14. A non-transitory computer readable medium, having instructions stored thereon that, when executed, cause a method of forming a three dimensional negated and or not-and (NAND) structure atop a substrate to be performed, the method comprising:
 (a) providing to a process chamber a substrate having alternating nitride layers and oxide layers formed atop the substrate and a photoresist layer formed atop the alternating nitride layers and oxide layers or alternating polycrystalline silicon layers and oxide layers;
 (b) etching the photoresist layer to expose at least a portion of the alternating nitride layers and oxide layers or alternating polycrystalline silicon layers and oxide layers;
 (c) providing a process gas comprising sulfur hexafluoride ($SF_6$), carbon tetrafluoride ($CF_4$), and oxygen ($O_2$) to the process chamber;
 (d) providing an RF power of about 4 kW to about 6 kW to an RF coil disposed proximate the process chamber to ignite the process gas to form a plasma; and
 (e) etching through a desired number of the alternating nitride layers and oxide layers or alternating polycrystalline silicon layers and oxide layers to form a feature of a NAND structure.

15. The non-transitory computer readable medium of claim 14, further comprising:
 (f) repeating (b)-(e) to form a plurality of adjacent features to at least partially form the NAND structure atop the substrate, wherein a depth of each feature decreases from a first side of the NAND structure to a second side of the NAND structure.

16. The non-transitory computer readable medium of claim 15, wherein the plurality of adjacent features form a NAND staircase structure.

17. The non-transitory computer readable medium of claim 14, wherein a bottom of the feature comprises an exposed portion of an oxide layer of the alternating nitride layers and oxide layers or alternating polycrystalline silicon layers and oxide layers formed atop the substrate.

18. The non-transitory computer readable medium of claim 14, wherein etching the photoresist layer comprises isotropically etching the photoresist layer to reduce a thickness and a width of the photoresist layer.

19. The non-transitory computer readable medium of claim 14, wherein providing the process gas comprises providing sulfur hexafluoride ($SF_6$) at about 5% to about 15% of a total flow of the process gas, carbon tetrafluoride ($CF_4$) at about 5% to about 15% of a total flow of the process gas and oxygen ($O_2$) at about 80% to about 90% of a total flow of the process gas.

20. The non-transitory computer readable medium of claim 14, wherein providing the RF power comprises providing an RF power at about 4.5 kW.

* * * * *